US010097166B1

United States Patent
Ludicky

(10) Patent No.: US 10,097,166 B1
(45) Date of Patent: Oct. 9, 2018

(54) TRANSFORMER COUPLED CONTROL ISOLATION FOR DIRECT CURRENT CONTROL SIGNALS

(71) Applicant: Hamilton Sundstrand Corporation, Charlotte, NC (US)

(72) Inventor: Frank J. Ludicky, Delavan, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/783,862

(22) Filed: Oct. 13, 2017

(51) Int. Cl.
  *H03B 1/00* (2006.01)
  *H03K 3/00* (2006.01)
  *H03K 3/013* (2006.01)

(52) U.S. Cl.
  CPC .................................. *H03K 3/013* (2013.01)

(58) Field of Classification Search
  CPC ........................................................ H03K 3/013
  USPC .............................................................. 327/109
  See application file for complete search history.

(56) References Cited

U.S. PATENT DOCUMENTS

| | | | |
|---|---|---|---|
| 6,654,409 B1 | 11/2003 | Scott et al. | |
| 8,477,856 B2 * | 7/2013 | Gaalaas | H04L 25/0266 326/60 |
| 9,031,140 B2 | 5/2015 | Zimmanck | |
| 2013/0194830 A1 * | 8/2013 | Nishino | H02M 1/08 363/20 |
| 2014/0049297 A1 * | 2/2014 | Nagai | H02M 1/08 327/109 |
| 2015/0380931 A1 | 12/2015 | Gan et al. | |
| 2018/0041130 A1 * | 2/2018 | Kunz | H02M 1/32 |

\* cited by examiner

*Primary Examiner* — Lincoln Donovan
*Assistant Examiner* — Metasebia Retebo
(74) *Attorney, Agent, or Firm* — Snell & Wilmer L.L.P.

(57) ABSTRACT

A switch drive and control arrangement may comprise a first transformer configured to receive a control signal, a second transformer configured to receive a clock signal, and a demodulator configured to receive the control signal and the clock signal from a switch controller, via the first transformer and the second transformer. The demodulator may be configured to output a demodulated signal in response to the control signal and the clock signal. A signal fault detector may be provided to determine a fault in at least one of the control signal and the clock signal. A switch may be turned off in response to a fault being detected in at least one of the control signal or the clock signal.

8 Claims, 4 Drawing Sheets

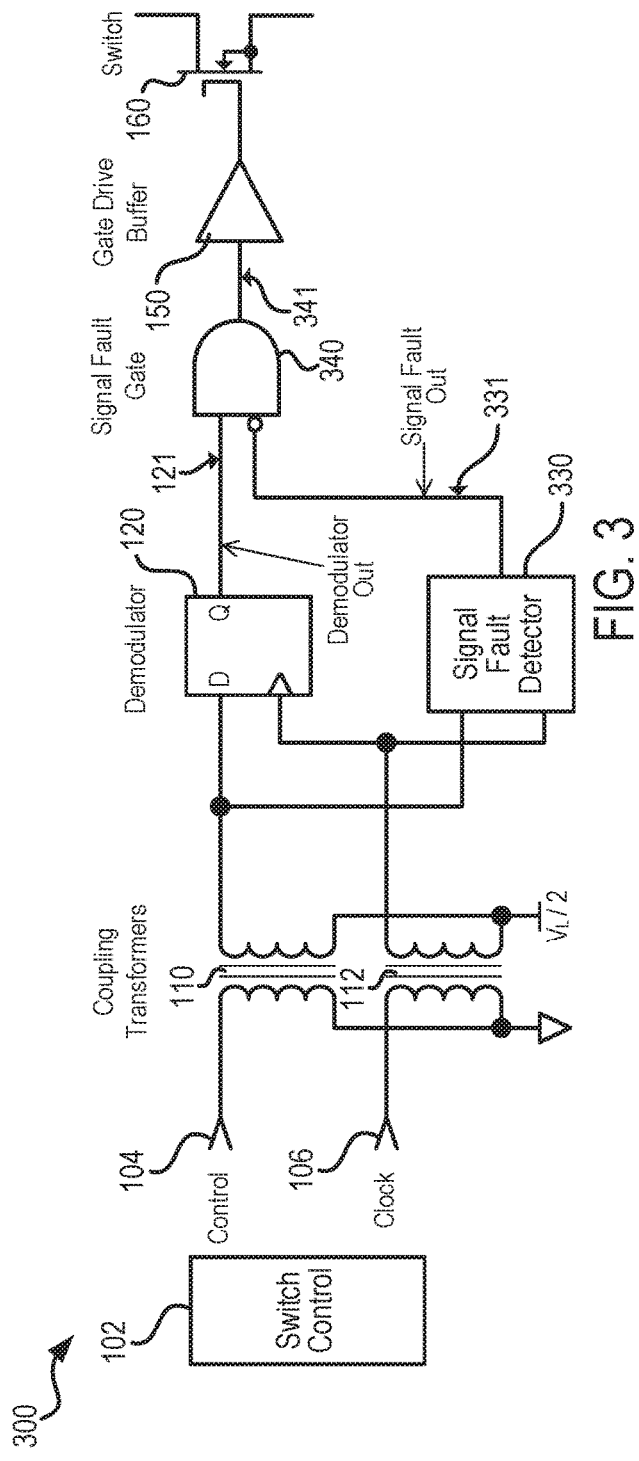
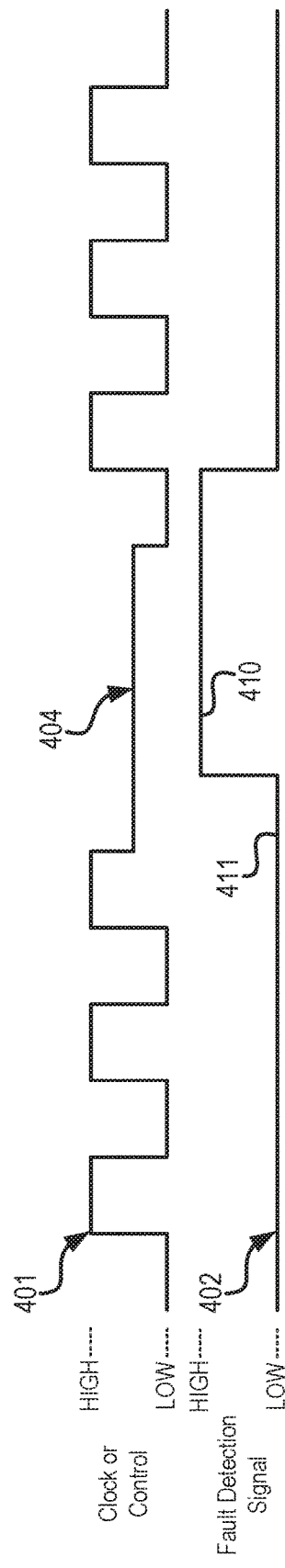
FIG. 3
FIG. 4

TRANSFORMER COUPLED CONTROL ISOLATION FOR DIRECT CURRENT CONTROL SIGNALS

FIELD

The disclosure generally relates to power electronics switches, and more particularly to systems and methods for controlling power electronics switches.

BACKGROUND

In systems utilizing power electronics switches, it may be desirable to provide electrical (galvanic) isolation between the low level or logic control components of the system and the components that directly drive the high power switches in the system. Control signals may be passed through this isolation barrier.

SUMMARY

A switch drive and control arrangement is provided, comprising a first transformer configured to receive a control signal, a second transformer configured to receive a clock signal, and a demodulator in electronic communication with the first transformer and the second transformer, the demodulator configured to receive the control signal and the clock signal, wherein the demodulator is configured to output a demodulated signal in response to the control signal and the clock signal.

In various embodiments, the control signal comprises an alternating current (AC) signal.

In various embodiments, the clock signal comprises an alternating current (AC) signal.

In various embodiments, the demodulated signal comprises a direct current (DC) signal.

In various embodiments, the demodulated signal is HIGH in response to the control signal indicating to turn on the switch and the demodulated signal is LOW in response to the control signal indicating to turn off the switch.

In various embodiments, the control signal indicates to the demodulator to at least one of turn the switch on or turn the switch off, in response to a first state of the control signal relative to a second state of the clock signal.

In various embodiments, the switch drive and control arrangement further comprises a gate drive buffer in electronic communication with the demodulator, wherein the gate drive buffer conditions the demodulated signal for the switch.

In various embodiments, the switch drive and control arrangement further comprises a switch controller configured to send the control signal and the clock signal, wherein the switch controller is galvanically isolated from the demodulator.

In various embodiments, the switch drive and control arrangement further comprises a switch, wherein the demodulated signal is configured to control the switch.

A switch drive and control arrangement is provided, comprising a first transformer configured to receive a control signal, a second transformer configured to receive a clock signal, a demodulator in electronic communication with the first transformer and the second transformer, the demodulator configured to receive the control signal and the clock signal, and a signal fault detector configured to determine a fault in at least one of the control signal and the clock signal, wherein the demodulator is configured to output a demodulated signal in response to the control signal and the clock signal.

In various embodiments, the signal fault detector is configured to output a fault detection signal.

In various embodiments, the switch drive and control arrangement further comprises a signal fault gate in electronic communication with the demodulator and the signal fault detector, wherein the signal fault gate is configured to output a gate signal in response to the demodulated signal and the fault detection signal.

In various embodiments, the gate signal turns on the switch in response to the demodulated signal indicating to turn on the switch and the fault detection signal indicating that the fault is absent in the control signal and the clock signal.

In various embodiments, the gate signal turns off the switch in response to the demodulated signal indicating to turn off the switch or the fault detection signal indicating that the fault is present in either of the control signal or the clock signal.

In various embodiments, the control signal indicates to the demodulator to turn the switch on or turn the switch off in response to a first state of the control signal relative to a second state of the clock signal.

In various embodiments, the switch drive and control arrangement further comprises a gate drive buffer in electronic communication with the signal fault gate, wherein the gate drive buffer conditions the gate signal for the switch.

In various embodiments, the switch drive and control arrangement further comprises a switch controller configured to send the control signal and the clock signal, wherein the switch controller is galvanically isolated from the demodulator.

A method for controlling a switch is provided, comprising sending a control signal to a demodulator, via a first transformer, sending a clock signal to the demodulator, via a second transformer, determining, by the demodulator, to output at least one of a switch-ON signal or a switch-OFF signal in response to the control signal and the clock signal, sending, by the demodulator, a demodulated signal comprising at least one of the switch-ON signal or the switch-OFF signal.

In various embodiments, the method further comprises determining, by a fault detector, if a fault is present in at least one of the clock signal and the control signal, sending, by the fault detector, a fault detection signal to a signal fault gate, sending, by the demodulator, the demodulated signal to the signal fault gate, sending, by the signal fault gate, a first gate signal in response to at least one of the demodulated signal comprising the switch-ON signal and the fault detection signal being false, and sending, by the signal fault gate, a second gate signal in response to at least one of the demodulated signal comprising the switch-OFF signal and the fault detection signal being true.

In various embodiments, the method further comprises receiving, by the switch, the demodulated signal, and switching, by the switch, from a first state to a second state in response to the demodulated signal.

The foregoing features, elements, steps, or methods may be combined in various combinations without exclusivity, unless expressly indicated herein otherwise. These features, elements, steps, or methods as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

FIG. 3 illustrates a schematic view of a switch drive and control arrangement, in accordance with various embodiments; and FIG. 4 illustrates a signal having a fault and a corresponding fault detection signal, in accordance with various embodiments.

DETAILED DESCRIPTION

Figure 1:
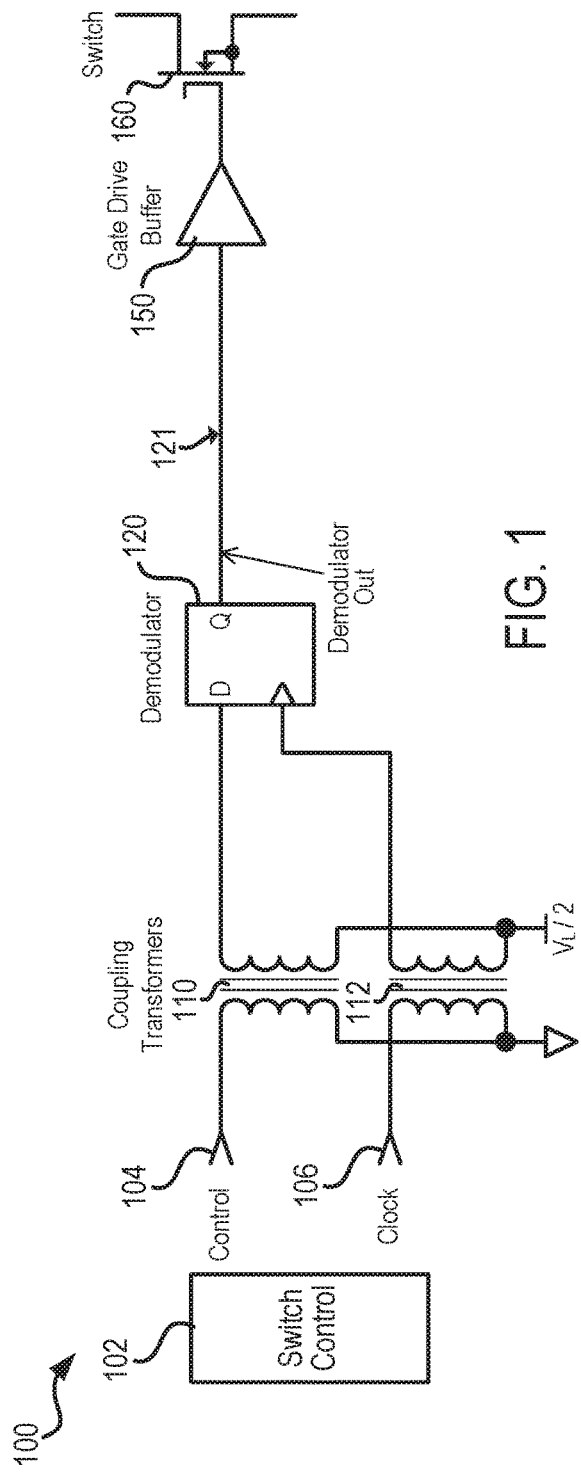
FIG. 1 illustrates a schematic view of a switch drive and control arrangement, in accordance with various embodiments.

The detailed description of various embodiments herein makes reference to the accompanying drawings, which show various embodiments by way of illustration. While these various embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling"). In that regard, use of the term "electronic communication" includes both "electrical communication" and "inductive communication."

In systems utilizing power electronics switches, it may be desirable to provide electrical (galvanic) isolation between the low level or logic control components of the system and the components that directly drive the high power switches in the system. Control signals may be passed through this isolation barrier. The disclosure provides an electronics arrangement for passing control signals through this isolation barrier.

A switch drive and control arrangement, as provided herein, may include a switch controller for sending a control signal across an isolation boundary to a switch. The control signal may be transformed into two pulse trains, clock and control, and passed through coupling transformers. The original control signal may then be extracted by the use of a demodulator. Additional logic may be included to prevent a fault or loss of either the clock signal or the control signal from causing erroneous operation of the switch.

There are various applications that may use transformers for control isolation. Direct use of transformers may not allow a switch to be turned on or off for arbitrarily long periods of time since transformers are AC coupled devices. The switch drive and control arrangement, in various embodiments, may not be subject to such limitations.

With reference to FIG. 1, a switch drive and control arrangement (also referred to herein as an arrangement) 100 is illustrated, in accordance with various embodiments. Arrangement 100 may include a first transformer 110, a second transformer 112, and a demodulator 120. In various embodiments, arrangement 100 may include a switch controller 102. In various embodiments, arrangement 100 may include a switch 160. Switch controller may control switch 160 via a control signal comprising a control signal 104 and a clock signal 106. Demodulator 120 may be configured to receive control signal 104 and clock signal 106. Switch controller 102 may send control signal 104 to demodulator 120 via first transformer 110. Switch controller 102 may send clock signal 106 to demodulator 120 via second transformer 112. In this regard, demodulator 120 may be in electronic communication with first transformer 110 and second transformer 112. Demodulator 120 may be galvanically isolated from switch controller 102 via first transformer 110 and second transformer 112. In various embodiments, demodulator 120 may comprise a D-type flip-flop demodulator. In various embodiments, transformer 110 and transformer 112 may comprise electrical devices that transfers electrical energy between switch control 102 and demodulator 120 through electromagnetic induction.

In various embodiments, demodulator 120 may output a demodulated signal 121 in response to control signal 104 and clock signal 106. Demodulator 120 may send demodulated signal 121 to switch 160. Arrangement 100 may include a gate drive buffer 150 coupled between demodulator 120 and switch 160. In various embodiments, gate drive buffer 150 may comprise an amplifier. Gate drive buffer 150 may condition demodulated signal 121 for switch 160. For example, gate drive buffer 150 may amplify demodulated signal 121. Demodulated signal 121 may be configured to control switch 160. For example, demodulated signal 121 may turn on and/or turn of a gate of switch 160.

Figure 2:
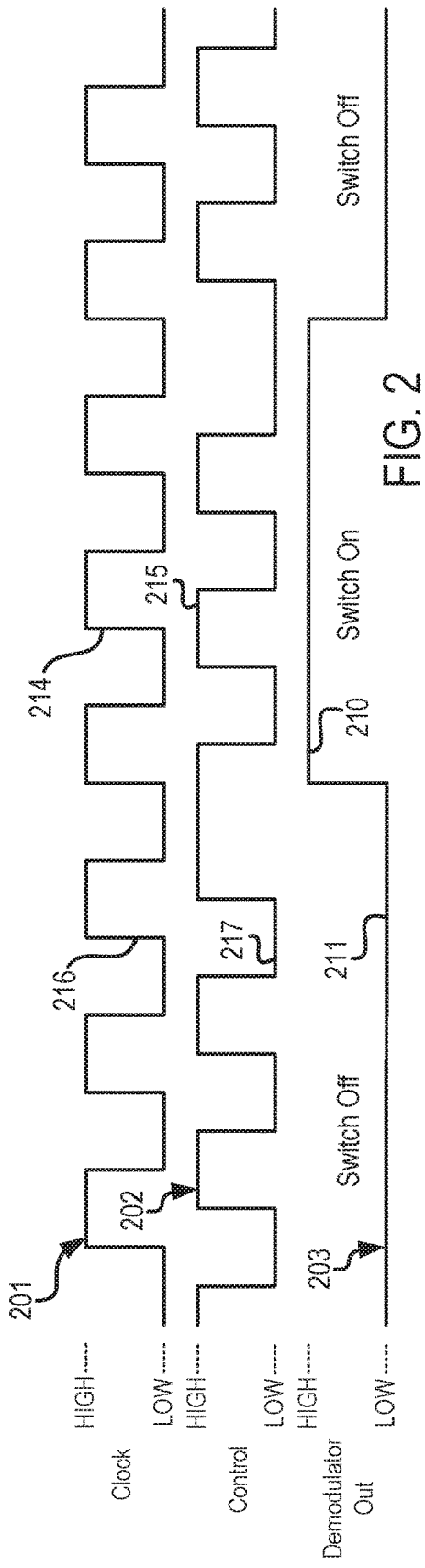
FIG. 2 illustrates a clock signal, a control signal, and a corresponding demodulated signal, in accordance with various embodiments.

With combined reference to FIG. 1 and FIG. 2, clock signal 106 may comprise a pulse train 201, control signal 104 may comprise a pulse train 202, and demodulated signal 121 may comprise a direct current (DC) signal 203. In various embodiments, demodulator 120 may output a first signal (also referred to herein as a switch-ON signal) 210 in response to control signal 104 indicating for switch 160 to be turned on. In various embodiments, first signal 210 may comprise a HIGH value. The term "HIGH" as referred to herein may refer to the maximum value of a pulse train. Demodulator 120 may determine to output first signal 210 in response to pulse train 202 comprising a HIGH value 215 simultaneously with a rising edge 214 of pulse train 201. First signal 210 may indicate for switch 160 to be switched on.

In various embodiments, demodulator 120 may output a second signal (also referred to herein as a switch-OFF signal) 211 in response to control signal 104 indicating for switch 160 to be turned off. In various embodiments, second signal 211 may comprise a LOW value. The term "LOW" as referred to herein may refer to the minimum value of a pulse train. Demodulator 120 may determine to output second signal 211 in response to pulse train 202 comprising a LOW value 217 simultaneously with a rising edge 216 of pulse train 201. Second signal 211 may indicate for switch 160 to be switched on. In this regard, control signal 104 may indicate for demodulator 120 to vary the state of a switch (e.g., turn on or turn off) in response to a first state (e.g., either HIGH or LOW) of control signal 104 relative to a second state (e.g., a rising edge) of clock signal 106.

In various embodiments, pulse train 201 may comprise a frequency of between one and one hundred megahertz (1-100 MHz). However, pulse train 201 may comprise any suitable frequency. Control signal 104 may comprise an alternating current (AC) signal. Clock signal 106 may comprise an AC signal.

With respect to FIG. 3, elements with like element numbering, as depicted in FIG. 1, are intended to be the same and will not necessarily be repeated for the sake of clarity.

With reference to FIG. 3, a switch drive and control arrangement (also referred to herein as an arrangement) 300 is illustrated, in accordance with various embodiments. Arrangement 300 may be similar to arrangement 100, with momentary reference to FIG. 1, except that arrangement 300 further comprises a signal fault detector 330 and a signal fault gate 340. In this manner arrangement 300 may be capable of determining a fault in control signal 104 and/or clock signal 106, including, but not limited to, a loss of the signal or an erroneous signal. In various embodiments, signal fault detector 330 may be configured to determine if a fault is present in control signal 104 and/or clock signal 106. Signal fault detector 330 may output a fault detection signal 331.

In various embodiments, signal fault gate 340 may receive demodulated signal 121 and fault detection signal 331. In various embodiments, signal fault gate 340 may comprise an AND gate. Signal fault gate 340 may output a gate signal 341. Gate signal 341 may comprise a switch-ON signal in response to demodulated signal 121 comprising a HIGH value and fault detection signal 331 indicating that no faults are detected in control signal 104 and clock signal 106. Fault detection signal 331 may comprise a LOW value in response to a fault being absent in both control signal 104 and clock signal 106.

In various embodiments, gate signal 341 may comprise a switch-OFF signal in response to demodulated signal 121 comprising a LOW value or fault detection signal 331 indicating that a fault is detected in either control signal 104 or clock signal 106. Fault detection signal 331 may comprise a HIGH value in response to a fault being present in either control signal 104 or clock signal 106. In various embodiments, signal fault detector 330 may comprise a one-shot, retriggerable multivibrator.

With combined reference to FIG. 3 and FIG. 4, pulse train 401 is illustrated having a fault 404. In various embodiments, pulse train 401 may be control signal 104. In various embodiments, pulse train 401 may be clock signal 106. Signal fault detector 330 may output fault detection signal 402 in response to control signal 104 and/or clock signal 106. In various embodiments, fault detection signal 402 may comprise a HIGH value 410 in response to a fault being detected in control signal 104 and/or clock signal 106. Fault detection signal 402 may comprise a LOW value 411 in response to no faults being detected in both control signal 104 and clock signal 106.

Figure 5:
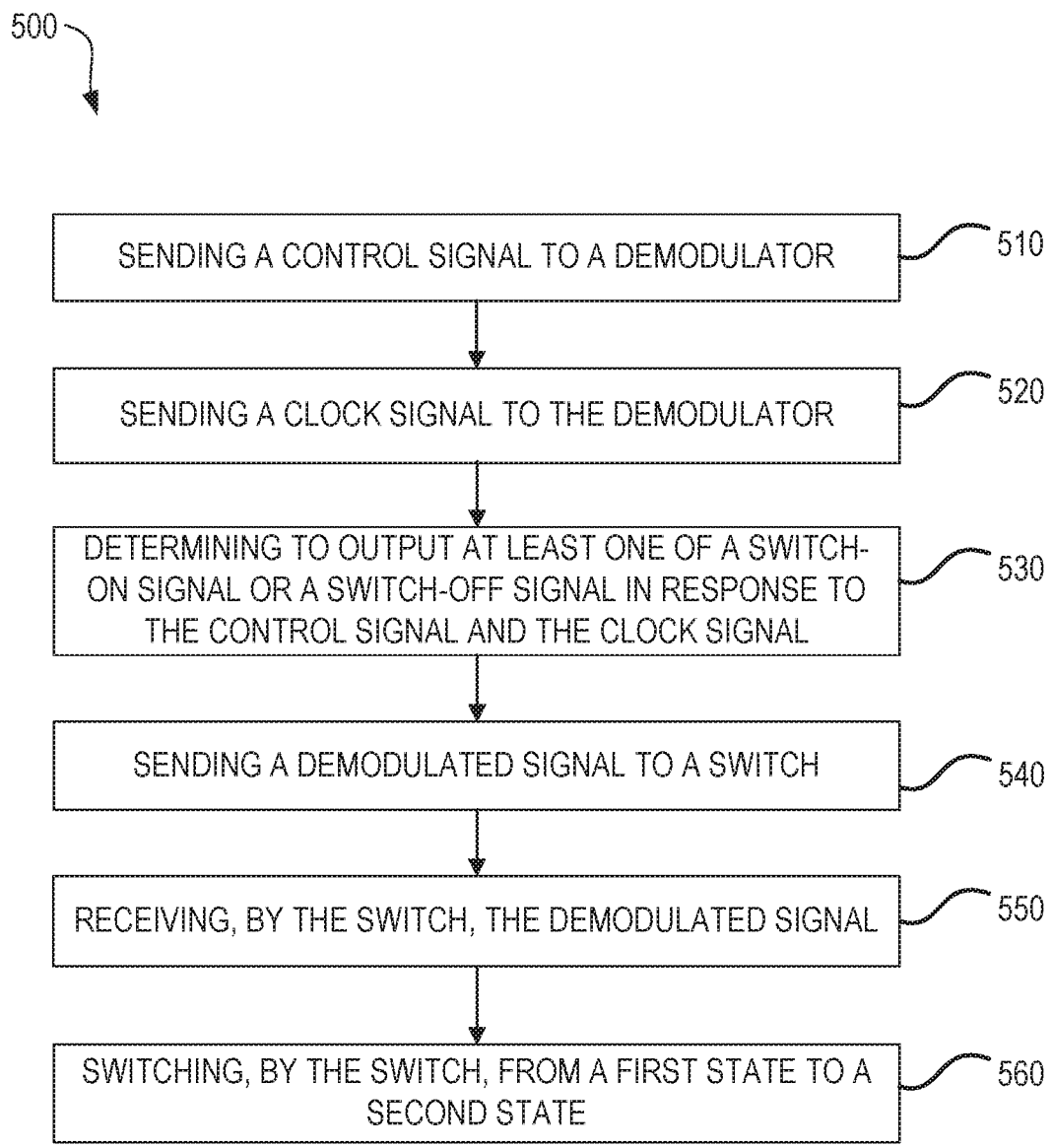
FIG. 5 and FIG. 6 illustrate methods for controlling a switch, in accordance with various embodiments.

With reference to FIG. 5, a method 500 for controlling a switch is illustrated, in accordance with various embodiments. Method 500 includes sending a control signal to a demodulator (step 510). Method 500 includes sending a clock signal to the demodulator (step 520). Method 500 includes determining to output at least one of a switch-ON signal or a switch-OFF signal in response to the control signal and the clock signal (step 530). Method 500 includes sending a demodulated signal to a switch (step 540). Method 500 includes receiving, by the switch, the demodulated signal (step 550). Method 500 includes switching, by the switch, from a first state to a second state (step 560).

With combined reference to FIG. 1 and FIG. 5, step 510 may include sending, by switch controller 102, control signal 104 to demodulator 120. Step 520 may include sending, by switch controller 102, clock signal 106 to demodulator 120. Step 530 may include determining, by demodulator 120, to output at least one of a switch-ON signal (e.g., first signal 210) or a switch-OFF signal (e.g., second signal 211) in response to control signal 104 and clock signal 106. Step 540 may include sending, by demodulator 120, demodulated signal 121 to switch 160. Step 550 may include receiving, by switch 160, demodulated signal 121. Step 560 may include switching, by switch 160, from a first state (e.g., switched on) to a second state (e.g., switched off).

Figure 6:
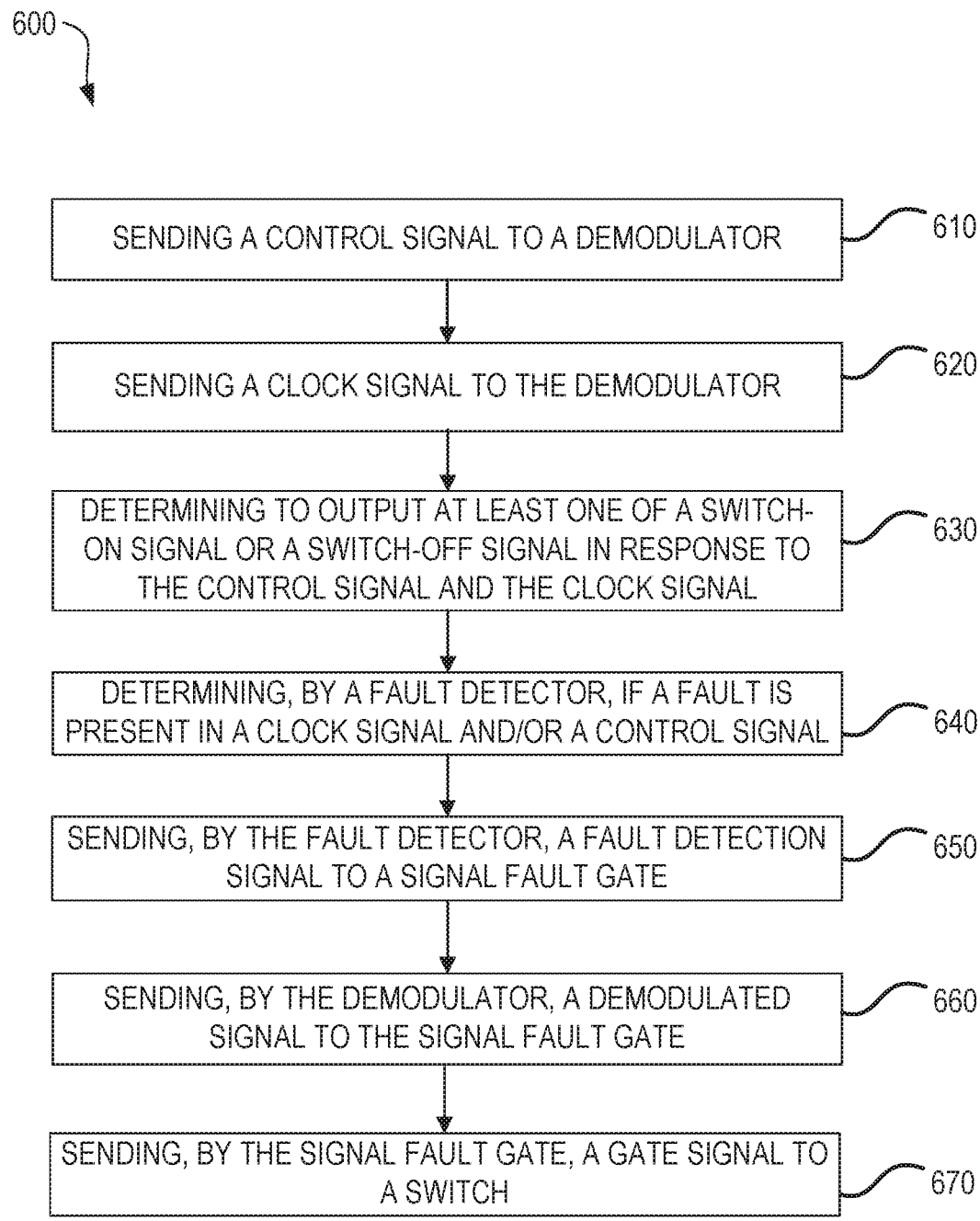

With reference to FIG. 6, a method 600 for controlling a switch is illustrated, in accordance with various embodiments. Method 600 includes sending a control signal to a demodulator (step 610). Method 600 includes sending a clock signal to the demodulator (step 620). Method 600 includes determining to output at least one of a switch-ON signal or a switch-OFF signal in response to the control signal and the clock signal (step 630). Method 600 includes determining, by a fault detector, if a fault is present in a clock signal and/or a control signal (step 640). Method 600 includes sending, by the fault detector, a fault detection signal to a signal fault gate (step 650). Method 600 includes sending, by the demodulator, a demodulated signal to the signal fault gate (step 660). Method 600 includes sending, by the signal fault gate, a gate signal to a switch (step 670).

With combined reference to FIG. 3 and FIG. 6, step 610 may include sending, by switch controller 102, control signal 104 to demodulator 120. Step 620 may include sending, by switch controller 102, clock signal 106 to demodulator 120. Step 630 may include determining, by demodulator 120, to output at least one of a switch-ON signal (e.g., first signal 210) or a switch-OFF signal (e.g., second signal 211) in response to control signal 104 and clock signal 106. Step 640 may include determining, by fault detector 330, if a fault is present in control signal 104 and/or clock signal 106. Step 650 may include sending, by fault detector 330, fault detection signal 331 to signal fault gate 340. Step 660 may include sending, by demodulator 120, demodulated signal 121 to signal fault gate 340. Step 670 may include sending, by signal fault gate 340, gate signal 341 to switch 160. Step 670 may include sending, by signal fault gate 340, gate signal 341 comprising a HIGH value (also referred to herein as a first gate signal) to switch 160. The HIGH value may be configured to turn on switch 160. Step 670 may include sending, by signal fault gate 340, gate signal 341 comprising a LOW value (also referred to herein as a second gate signal) to switch 160. The LOW value may be configured to turn off switch 160.

Benefits, other advantages, and solutions to problems have been described herein with regard to specific embodiments. Furthermore, the connecting lines shown in the various figures contained herein are intended to represent various functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switch drive and control arrangement, comprising:
   a first transformer configured to receive a control signal;
   a second transformer configured to receive a clock signal;
   a demodulator in electronic communication with the first transformer and the second transformer, the demodulator configured to receive the control signal and the clock signal; and
   a signal fault detector configured to determine a fault in at least one of the control signal and the clock signal and configured to output a fault detection signal; and
   a signal fault gate in electronic communication with the demodulator and the signal fault detector, wherein the signal fault gate is configured to output a gate signal in response to the demodulated signal and the fault detection signal;
   wherein the demodulator is configured to output a demodulated signal in response to the control signal and the clock signal.

2. The switch drive and control arrangement of claim 1, wherein the gate signal turns on the switch in response to the demodulated signal indicating to turn on the switch and the fault detection signal indicating that the fault is absent in the control signal and the clock signal.

3. The switch drive and control arrangement of claim 1, wherein the gate signal turns off the switch in response to the demodulated signal indicating to turn off the switch or the fault detection signal indicating that the fault is present in either of the control signal or the clock signal.

4. The switch drive and control arrangement of claim 1, wherein the control signal indicates to the demodulator to turn the switch on or turn the switch off in response to a first state of the control signal relative to a second state of the clock signal.

5. The switch drive and control arrangement of claim 1, further comprising a gate drive buffer in electronic communication with the signal fault gate, wherein the gate drive buffer conditions the gate signal for the switch.

6. The switch drive and control arrangement of claim 1, further comprising a switch controller configured to send the control signal and the clock signal, wherein the switch controller is galvanically isolated from the demodulator.

7. A method for controlling a switch, comprising:
   sending a control signal to a demodulator, via a first transformer;
   sending a clock signal to the demodulator, via a second transformer;
   determining, by the demodulator, to output at least one of a switch-ON signal or a switch-OFF signal in response to the control signal and the clock signal;
   determining, by a fault detector, if a fault is present in at least one of the clock signal and the control signal;
   sending, by the fault detector, a fault detection signal to a signal fault gate;
   sending, by the demodulator, a demodulated signal comprising at least one of the switch-ON signal or the switch-OFF signal to the signal fault gate;
   sending, by the signal fault gate, a first gate signal in response to at least one of the demodulated signal comprising the switch-ON signal and the fault detection signal being false; and
   sending, by the signal fault gate, a second gate signal in response to at least one of the demodulated signal comprising the switch-OFF signal and the fault detection signal being true.

8. The method of claim 7, further comprising:
   receiving, by the switch, the demodulated signal; and
   switching, by the switch, from a first state to a second state in response to the demodulated signal.

* * * * *